United States Patent
Waldrip et al.

(10) Patent No.: US 7,435,297 B1
(45) Date of Patent: Oct. 14, 2008

(54) MOLTEN-SALT-BASED GROWTH OF GROUP III NITRIDES

(75) Inventors: Karen E. Waldrip, Albuquerque, NM (US); Jeffrey Y. Tsao, Albuquerque, NM (US); Thomas M. Kerley, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 522 days.

(21) Appl. No.: 11/102,357

(22) Filed: Apr. 8, 2005

Related U.S. Application Data

(60) Provisional application No. 60/560,571, filed on Apr. 8, 2004.

(51) Int. Cl.
C30B 28/12 (2006.01)
C30B 25/00 (2006.01)
C30B 29/38 (2006.01)

(52) U.S. Cl. ............ 117/89; 117/84; 117/105; 117/108; 117/952

(58) Field of Classification Search ............ 117/84, 117/89, 105, 108, 952
See application file for complete search history.

(56) References Cited

U.S. PATENT DOCUMENTS

| | | | | |
|---|---|---|---|---|
| 6,127,280 | A * | 10/2000 | Stutz | 438/746 |
| 6,139,629 | A * | 10/2000 | Kisielowski et al. | 117/105 |
| 6,218,280 | B1 * | 4/2001 | Kryliouk et al. | 438/607 |
| 6,265,322 | B1 * | 7/2001 | Anselm et al. | 438/745 |
| 6,379,472 | B1 * | 4/2002 | Kisielowski et al. | 148/33.1 |
| 6,884,740 | B2 * | 4/2005 | Hu et al. | 438/708 |
| 2003/0045120 | A1 * | 3/2003 | Hu et al. | 438/745 |
| 2006/0048701 | A1 * | 3/2006 | Feigelson et al. | 117/89 |
| 2007/0248526 | A1 * | 10/2007 | Spencer et al. | 423/412 |

OTHER PUBLICATIONS

Yujiang Song et al, "Preparation and Characterization of bulk GaN Crystals" Journal of Crystal Growth, 206 (2004), pp. 327-330.

Toru H. Okabe et al, "Electrochemical Properties of $Li_3N$ Dissolved in Molten LiCl at 900 K", Journal of The Electrochemical Society, 148 (5) (2001) pp. E219-E226.

T. Ogawa et al, "Dissolution and Formation of Nuclear Materials in Molten Media", Pure and Applied Chemistry vol. 73, No. 5, 2001, pp. 799-806.

Izabella Grzegory, "High Pressure Growth of Bulk GaN from Solutions in Gallium", Journal of Physics Condensed Matter, vol. 13, 2001, pp. 6875-6892.

A.D. Franklin, "Electrochemical Growth of Crystals from Electrolyte Solutions," Journal of Crystal Growth, 34 (1976), pp. 245-247.

Takuya Goto et al, "Electrochemical Reduction of Nitrogen Gas in a Molten Chloride System", Electrochimica Acts, vol. 43, Nos. 21-22, pp. 3379-3384, 1998.

(Continued)

*Primary Examiner*—Robert M. Kunemund
*Assistant Examiner*—G. Nagesh Rao
(74) *Attorney, Agent, or Firm*—Carol Ashby

(57) ABSTRACT

A method for growing Group III nitride materials using a molten halide salt as a solvent to solubilize the Group-III ions and nitride ions that react to form the Group III nitride material. The concentration of at least one of the nitride ion or Group III cation is determined by electrochemical generation of the ions.

32 Claims, 5 Drawing Sheets

OTHER PUBLICATIONS

T. Goto, et al, "Electrochemical Surface Nitriding of Titanium in Molten Salt System," Electrochimica Acts, vol. 39, Nos. 8-9, pp. 1107-1113, 1994.

Takuya Goto et al, "Electrochemical Formation of Iron Nitride Film in a Molten LiCl-KCl-$Li_3N$ System," Electrochimica Acts, vol. 45, pp. 3367-3373, 2000.

Douglas R. Ketchum, et al, "Crystal Growth of Gallium Nitride in Supercritical Ammonia," Journal of Crystal Growth, 222, (2001) pp. 431-434.

Golubev et al, "Liquid Phase Electroepitaxy of III-V Semiconductors", Journal of Crystal Growth, 146 (1995) pp. 277-282.

Travis Wade et al, "Electrochemical Synthesis of Ceramic Materials. 5. An Electrochemical Method Suitable for the Preparation of Nine Metal Nitrides" American Chemical Society, vol. 9, No. 1, 1997, pp. 248-254.

H. Yamane et al, "GaN Single Crystal Growth from a Na-Ga Melt" Journal of Materials Science 35 (2000) 801-808.

* cited by examiner

MOLTEN-SALT-BASED GROWTH OF GROUP III NITRIDES

This application claims priority benefit from U.S. Provisional Patent Application Ser. No. 60/560,571, filed on Apr. 8, 2004, which is incorporated herein by reference.

The United States Government has rights in this invention pursuant to Department of Energy Contract No. DE-AC04-94AL85000 with Sandia Corporation.

BACKGROUND OF THE INVENTION

Large-area low-dislocation-density column-III nitride substrates are needed for epitaxial growth of thin-film III-nitride materials for optoelectronic and high-frequency, high-power electronics. Current technology employs sapphire ($Al_2O_3$) or silicon carbide (SiC) as substrates, which are highly lattice-mismatched to GaN (+17% and −3.5%, respectively), and result in dislocation densities in the $10^9$-$10^{11}$ per cm range. Dislocation filtering mechanisms, such as epitaxial lateral overgrowth or cantilever epitaxy involve numerous difficult processing steps. These increase the cost of the manufacturing process and can also decrease yield. They typically reduce the total threading dislocation density by a factor of $10^2$, which is not enough to reach the dislocation densities on the order of $10^5$/cm$^2$ or fewer that are desired for long-lived commercial devices.

For virtually all semiconductor materials, the largest-area lowest-dislocation-density substrates are grown by melt-based approaches. Hence, it would be desirable to apply such approaches to the III-nitrides. Indeed, for GaN, melt-based growth approaches are being pursued, either by dissolving nitrogen in a gallium melt (for example, see I. Grzegory, "High pressure growth of bulk GaN from solutions in gallium," J. Phys. Condens. Matter 13 (2001) p 6875-6892), or dissolving gallium nitride in a liquid ammonia solvent, followed by precipitation of gallium nitride (for example, see D. R. Ketchum and J. W. Kolis, "Crystal growth of gallium nitride in supercritical ammonia," J. Crystal Growth 22 (2001) p. 431-434). In both cases, however, enhancing the solubility of the gallium nitride precursors requires thousands of atmospheres of pressure. Even with such overpressures, the solubilities are low and the precipitation kinetics slow. Moreover, the pressure regimes (4,000 to 45,000 atmospheres) of these approaches will likely limit their scalability and manufacturability.

GaN single crystals have been prepared in a sealed stainless-steel tube container at 650-840° C. for 6-300 h using Ga, $NaN_3$, and Na as starting materials. A thin GaN layer covered Na—Ga melt surface at the initial stage of reaction between Ga in the Na—Ga melt and $N_2$ given by the thermal decomposition of $NaN_3$ around 300° C. In the next stage, pyramidal and prismatic GaN single crystals grew under the layer. Prismatic and platelet crystals also grew from the melt which wetted the tube wall. The reaction rate was enhanced by increasing temperature and by increasing Na content in the melt. The maximum size of pyramidal crystals was about 0.7 mm. The platelet crystals were 1-2 mm in one direction and <0:05 mm thick (H. Yamane et al., "GaN single crystal growth from a Na—Ga melt," J. Mater. Sci. 35 (200) p. 801-808).

The growth conditions for hexagonal GaN platelet crystals using a Li flux were reported by Y. T. Song et al., "Preparation and characterizations of bulk GaN crystals," J. Crystal Growth 260 (2004) p. 327-330. The starting materials used for the growth of the GaN single crystals were Ga (99.999%) and $Li_3N$ (99.5%). These materials in proper proportion were put in a tungsten crucible and were heated to 800° C. in growth furnace which was charged with $N_2$ gas of 1-2 atm at room temperature and then was slowly cooled at a rate of 2-3° C. per day. Hexagonal GaN platelet crystals can be obtained, and separated from residual substances by soaking in HCl solution. The experimental results confirmed that these crystals crystallized from Li—Ga—N liquid phase.

Liquid phase electroepitaxy (LPEE) is a method of crystal growth in which the layer growth is initiated and sustained by passing a direct electric current through the solution-substrate interface while the temperature of the overall system is maintained constant. This method may also be called electroliquid epitaxy (ELE) or current controlled liquid phase epitaxy (CCLPE). A review of LPEE is found in Golubev et al., "Liquid phase electroepitaxy of III-V semiconductors," J. Crystal Growth 146 (1995) p. 277-282.

The successful melt-based bulk III-nitride growth approach will be one that is scalable, manufacturable, moderately inexpensive, and controllable. It should have a high growth rate and produce a low impurity content. It should produce crystals of superior crystalline quality (dislocation densities below $10^7$ cm$^{-2}$). It is also desirable that the technique be applicable to all of the III-nitrides of technological interest, that is, AlN, GaN and InN.

SUMMARY OF THE INVENTION

This invention comprises a method for growing GaN and other Group III-nitride materials using a molten halide salt as a solvent for the Group III-N precursors. The concentration of at least one of the nitride ion or Group III cation is determined by electrochemical generation of the ions. The molten halide salts serve to solubilize both Group III ions and nitride ions without reacting with either of them at a level that significantly restricts their ability to react with each other to form III-N crystals. Use of this solvent system permits growth at or near atmospheric pressure. Electrochemical methods are used as part of some embodiments of this invention to grow the III-nitride materials.

Additional objects, advantages, and novel features of the invention will become apparent to those skilled in the art upon examination of the following description or may be learned by practice of the invention. The objects and advantages of the invention may be realized and attained as particularly pointed out in the appended claims.

BRIEF DESCRIPTION OF THE DRAWINGS

The accompanying drawings, which are incorporated in and form part of the specification, illustrate some embodiments of the present invention and, together with the description, serve to explain the principles of the invention.

DETAILED DESCRIPTION OF THE INVENTION

This invention comprises a method for growing Group III nitride materials using a molten halide salt as a solvent to solubilize the Group-III ions and nitride ions that react to form the Group III nitride material. The concentration of at least one of the nitride ion or Group III cation is determined by electrochemical generation of the ions. Molten halide salts can solubilize both Group III cations, such as Al, Ga, and In ions, and nitride ions, without reacting with them to the extent that they are no longer available for reaction with each other. Literature reports (T. H. Okabe, A. Horiuchi, K. T. Jacob, and Y. Waseda, "Electrochemical Properties of $Li_3N$ Dissolved in Molten LiCl at 900K," J. Electrochem. Soc. 148 (2001) p. E219-E226) indicate that nitride ion concentrations in LiCl at 650° C. can be as high as 2.8 mol %, which is a sufficiently high concentration to permit high growth rates of Group III nitride (on the order of 0.01 to $\geq 1$ mm/hr under diffusion-limited growth conditions). Molten salts are compatible with the 350-1200° C. temperatures that permit the growth of high-quality single-crystal Group III-nitrides, also called III-nitrides. Since the molten salts can be used to dissolve a useful quantity of precursor ions at or near atmospheric pressure, scalability of this method to wafer-scale production does not present the same problems associated with other very-high-pressure melt-based or volatile-solvent processes. The molten salts are good solvents for III-nitride precursors and serve as an electrolyte in electrochemical processes for the growth of III-nitrides.

The embodiments described herein illustrate ways to establish concentrations of III-nitride precursors useful for III-nitride growth in molten salt solutions. In some embodiments, both precursors are created through dissolution in the molten salt of precursor materials containing the desired Group III ions and nitride ions; this is followed by reaction and precipitation of the Group III nitride. Either a Group III cation or a nitride ion is called a constituent ion. The material providing the nitride ion is called a nitride ion precursor. The material providing the Group III ion is called a Group III ion precursor. In other embodiments, one or both of the Group III and nitride precursor ions are created electrochemically within the molten salt solution before reaction and precipitation. Electrochemical generation of an excess of a constituent ion can help to maintain precursor supersaturation, saturation, or near-saturation. Some embodiments provide one ion type by dissolution of precursor materials containing that ion and the other ion type is generated electrochemically.

Figure 1:
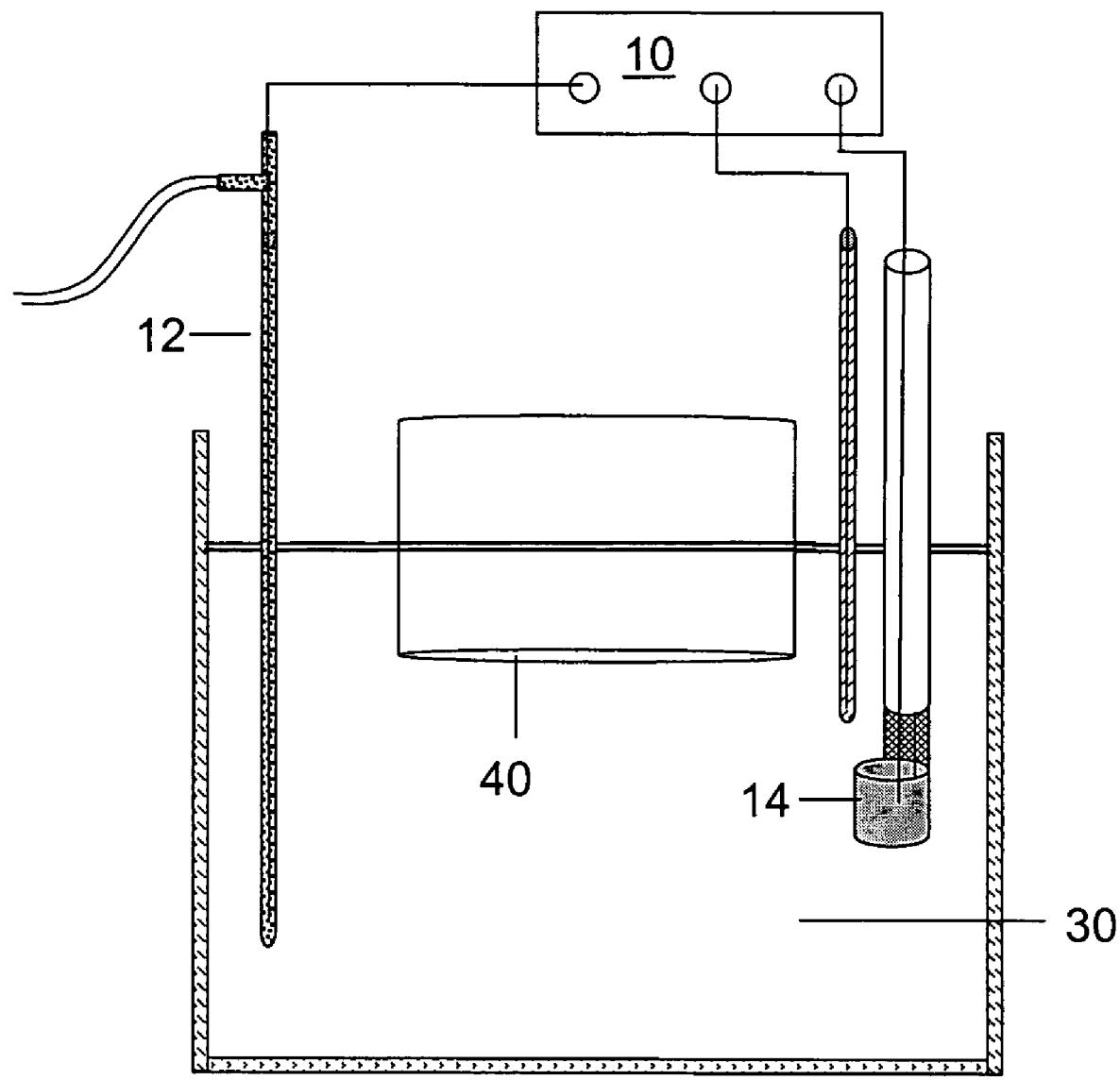
FIG. 1 illustrates electrochemical generation of both Group III cations and nitride ions. Anode and cathode are separated by a distance to avoid premature reaction.
Figure 2:
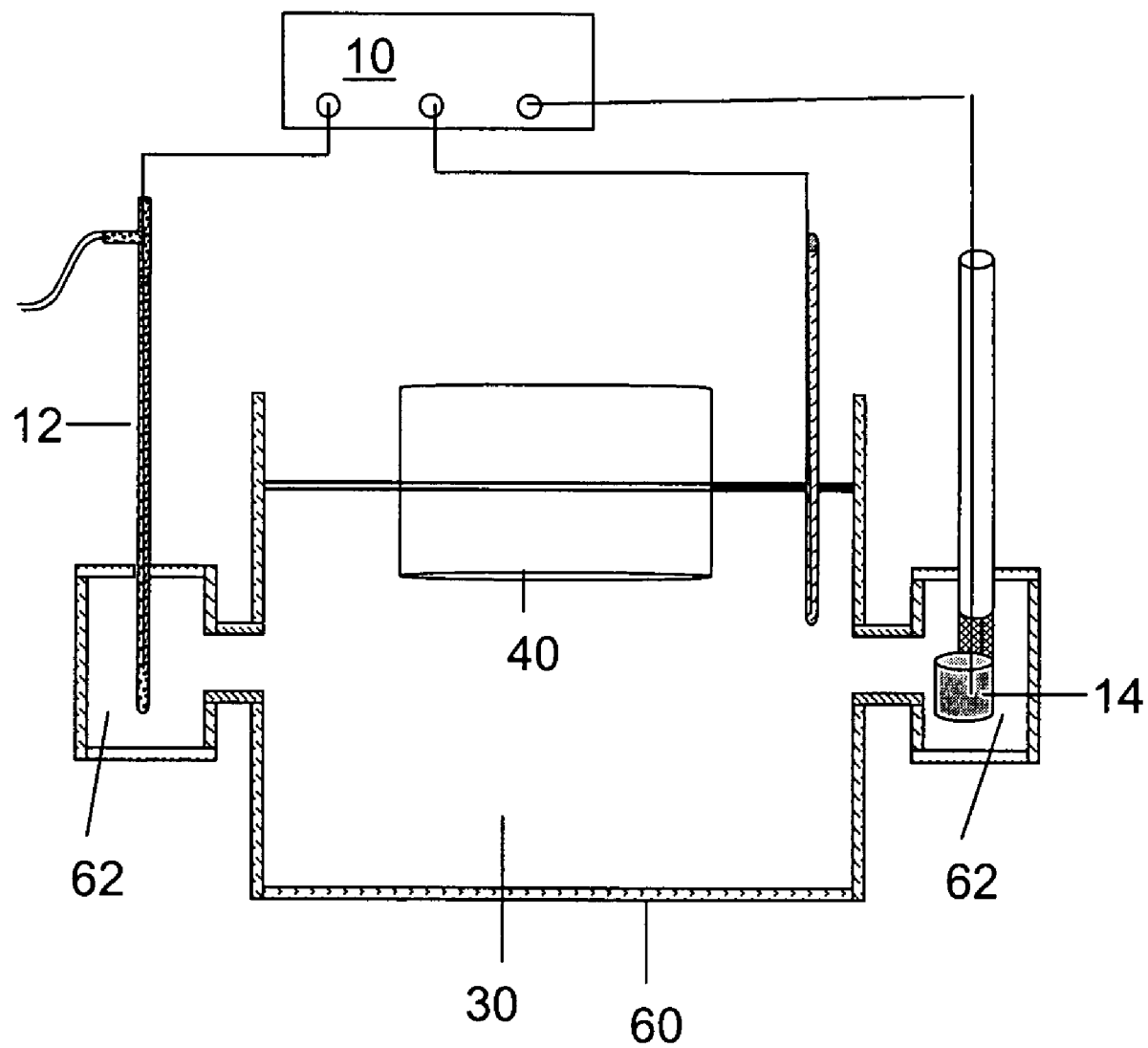
FIG. 2 Illustrates electrochemical generation of both Group III cations and nitride ions in side chambers with independent heating units for temperature control.
Figure 3:
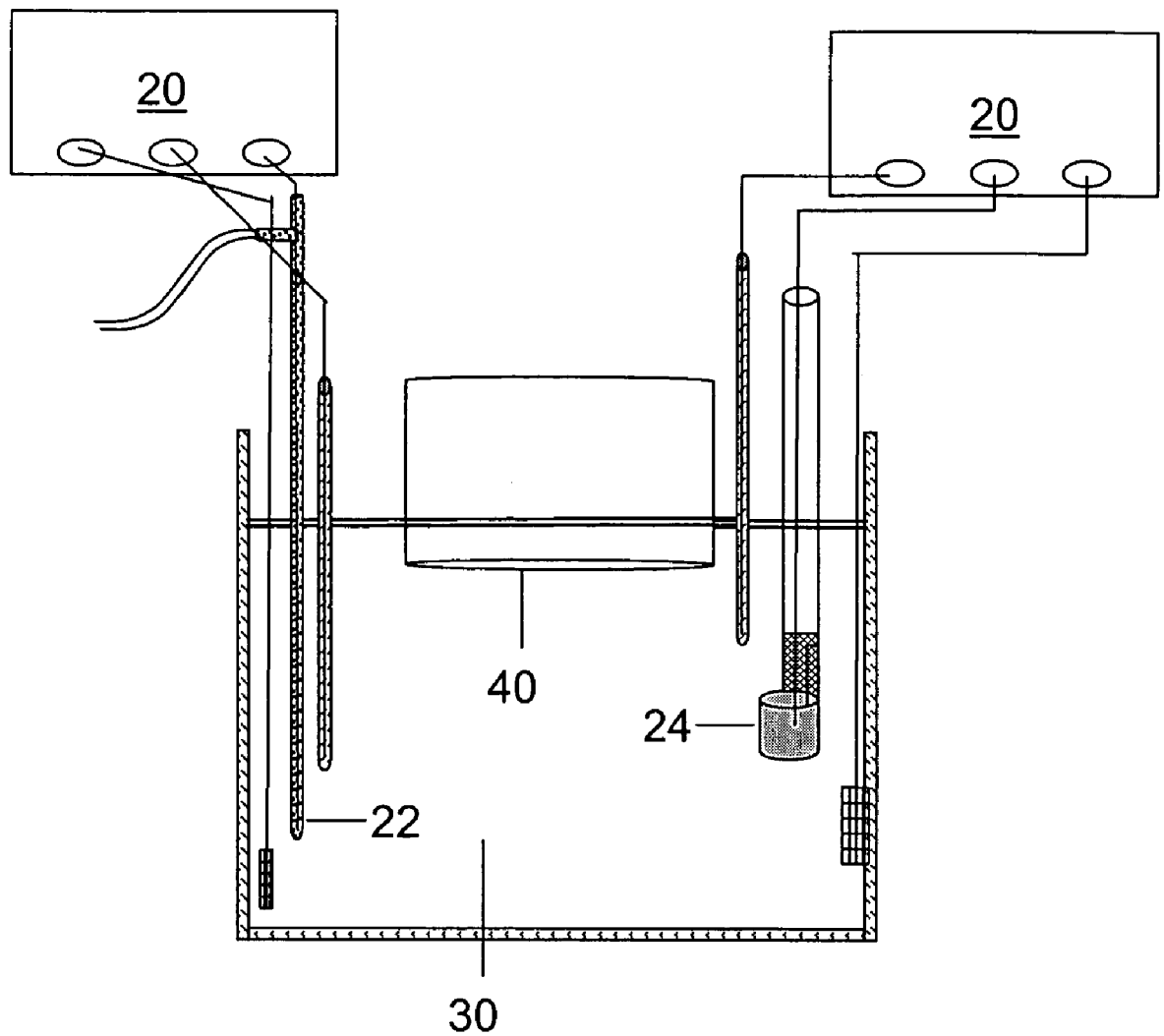
FIG. 3 illustrates electrochemical generation of both Group III cations and nitride ions using separate potentiostats to control generation of the cations and nitride anions.

In some embodiments, both precursors are created electrochemically. Rather than dissolving precursor compounds containing the Group III ions or nitride ions into the molten salt solution, the cationic ($M^{3+}$) and anionic ($N^{3-}$) components are electrochemically formed in solution at locations separated by a relatively large distance in the melt to prevent premature reaction (see FIGS. 1 through 3 for illustrations of three possible electrochemical cell configurations; these are representative only and do not portray actual cell dimensions and electrode shapes). This in-situ generation of the precursor ions alleviates the typical difficulties of solution growth associated with the reduction or cessation of crystal growth at a given solution temperature due to precipitation-induced lowering of the concentration of precursors (or degree of supersaturation) by continuously generating precursors in the solution in a controlled manner. This can be accomplished by using multiple potentiostats or power supplies, or through the use of a single potentiostat or power supply 10. FIGS. 1 and 2 illustrate configurations using single potentiostats for simplicity. FIG. 3 illustrates a configuration using separate potentiostats 20 for the Group III electrode 24 and the nitrogen electrode 22. The electrodes are immersed in the molten salt solvent 30. Nitrogen is reduced at one electrode 12 (the cathode) while the metal is oxidized at the other electrode 14 (the anode) if a single power supply or potentiostat 10 is employed. If multiple power supplies 20 are employed, then the respective half-reactions are operative and oxidation or reduction of the proper component of the salt would occurs at the opposing electrode. In FIG. 3, oxidation of the Group III metal to form the cation occurs at the Group III electrode 24. Reduction of nitrogen gas to form nitride ion occurs at the nitrogen electrode 22. The concentrations of the electrochemically-generated ions are maintained below the solubility limit of the III-nitride in the molten salt to prevent instantaneous precipitation in the solution at the point of ion generation rather than at the desired crystal growth location. The slow growth rate resulting from the low concentration of precursors can be improved by controlling the rate at which ions are transported to the growth surface via forced salt flow. A temperature gradient at the growth surface 40 allows precipitation due to supersaturation of the III-nitride in that region. FIG. 1 illustrates an embodiment where the electrodes are in the same reaction chamber as the growth surface 40. FIG. 2 illustrates an embodiment where the electrodes are situated in compartments 62 attached to the main body of the reaction chamber 60 containing the growth surface 40. These compartments can be heated to temperatures different from that of the main body of the reaction chamber 60.

The concentrations of the ions (Group III ion and nitride ion) are kept below the solubility limit at the chosen process temperature in regions of the growth chamber where crystal growth is not desired. The concentrations of the Group III ions and nitride ions are kept below the solubility limit of III-Nitride (III-N) in solution; i.e., $III^{3+}+N^{3-} \Leftrightarrow III-N$ lies to the left of equilibrium in the bulk of the solution. A thermal gradient is employed to push the reaction to the right of equilibrium in the vicinity of the growth surface, which contains the seed crystal or nucleation site. Reaction of the ionic precursors followed by precipitation of the III-N takes place near or on the nucleation site. If the growth rate of III-N is lower than is desired due to the low solubility limit of the III-N in the molten salt solvent, the growth rate may be increased by using a forced salt flow to control the fluid dynamics and deliver the precursors to the growth surface at a rate faster than the precursor diffusion rate in the molten salt solvent.

Precipitation at the position where the nitride crystal is to be grown 40 (defined as the XY plane where the plane is limited to the lateral dimensions of the growing crystal) is controlled via a thermal gradient, selected for optimization of growth rate or crystal quality. The position where the nitride crystal is to be grown may not be strictly planar; the term XY plane includes this condition. The thermal gradient is selected based on the solubility vs. temperature data for the solute and solvent. The ideal solubility (x) of a solute in an ideal solvent follows the equation In $x = \Delta S_{fus}/T^{*}((T_m/T)-1)$, where $\Delta S_{fus}$ and $T_m$ refer to the entropy of fusion and the melting temperature of the solute, respectively. If the solubility is not ideal, then the solubility will deviate from this equation. If the attractive forces between the solute and solvent molecules are stronger than the solute-solute interactions, there will be a positive deviation from ideal. If the solute-solute interactions are stronger than the solute-solvent attractive (or sometimes repulsive) forces, then there will be a negative deviation from ideal solubility. In extreme cases, the heat of dissolution of the solute in the solvent can be positive, resulting in retrograde solubility, or a situation in which the solute is more soluble at colder temperatures than at hotter temperatures. In the case that the III-N solute exhibits positive solubility (i.e., the solute is more soluble at hotter temperatures), then the growth surface is kept at a colder temperature than the rest of the melt. In the retrograde solubility case, the growth surface is kept hotter than the rest of the melt. The crystal growth rate and quality are strong functions of the temperature gradient, which can range from 0.001° C./cm to 100° C./cm and is chosen to influence the desired crystal growth rate and quality.

In one embodiment, the temperature or the molten salt solvent is increased to a temperature higher than the desired growth temperature for the III-nitride. Sufficient molecular III-N precursor is dissolved to saturate the molten salt solvent with III-N. For example, powdered GaN was added to molten LiCl until it was saturated at 950° C. A seed crystal was inserted into the melt and the melt was cooled to its solidification temperature of 610° C. Crystallites formed on the surface of the seed crystal; they measured greater than 10×10×5 micrometers.

In one embodiment, the temperature or the molten salt solvent is increased to a temperature higher than the desired growth temperature for the III-nitride. Sufficient molecular III-N precursor is dissolved to saturate the molten salt solvent with III-N. For example, powdered III-N can be added to the solution until it is saturated. The driving force for precipitation, termed the degree of supersaturation, is obtained by cooling the solution to the desired growth temperature. A seed crystal is placed in the solution at the desired growth location to encourage nucleation and growth. An excess of Group III cations or $N^{3-}$ ions may be electrochemically generated in solution and delivered to the growth surface via forced salt flow or some other method.

In one embodiment, the group III precursor is made electrochemically and the nitride precursor is created electrochemically by reduction of nitrogen gas in the molten salt solvent. Growth of III-nitride occurs directly on the surface of the molten metal electrode. The electrodes were placed approximately 1 cm apart, but can be placed at different separations, depending on reaction vessel geometry. Growth of III-N crystals can be accomplished in this embodiment using one of several varieties of electrochemical protocols. One protocol employs repeated scanning of the voltage (potentiodynamic deposition conditions) between −2.35 and 0.6 Volts vs. Ag/AgCl for liquid Ga anode and a nickel cathode. Another protocol employs repeatedly scanning of the current (galvanodynamic deposition conditions) between open circuit (0.000 A/cm$^2$) and about 100 mA/cm$^2$. The scan rates employed in the experiments described here were 4 mV/sec and 0.05 mA/3 sec (0.05 mA steps at 3 second intervals), but other scan rates can be used. Another protocol employs holding the potential of the working electrode constant (potentiostatic deposition conditions), for example, by holding the gallium electrode at 0.4 volts vs. Ag/AgCl at 450° C., or by holding the nickel electrode at e.g. −2.35 volts vs. Ag/AgCl for the desired growth time. Another protocol employs holding the current density constant (galvanostatic deposition conditions) for the desired growth time. Generally, the potentiostatic or potentiodynamic deposition conditions will produce the desired material.

Figure 4:
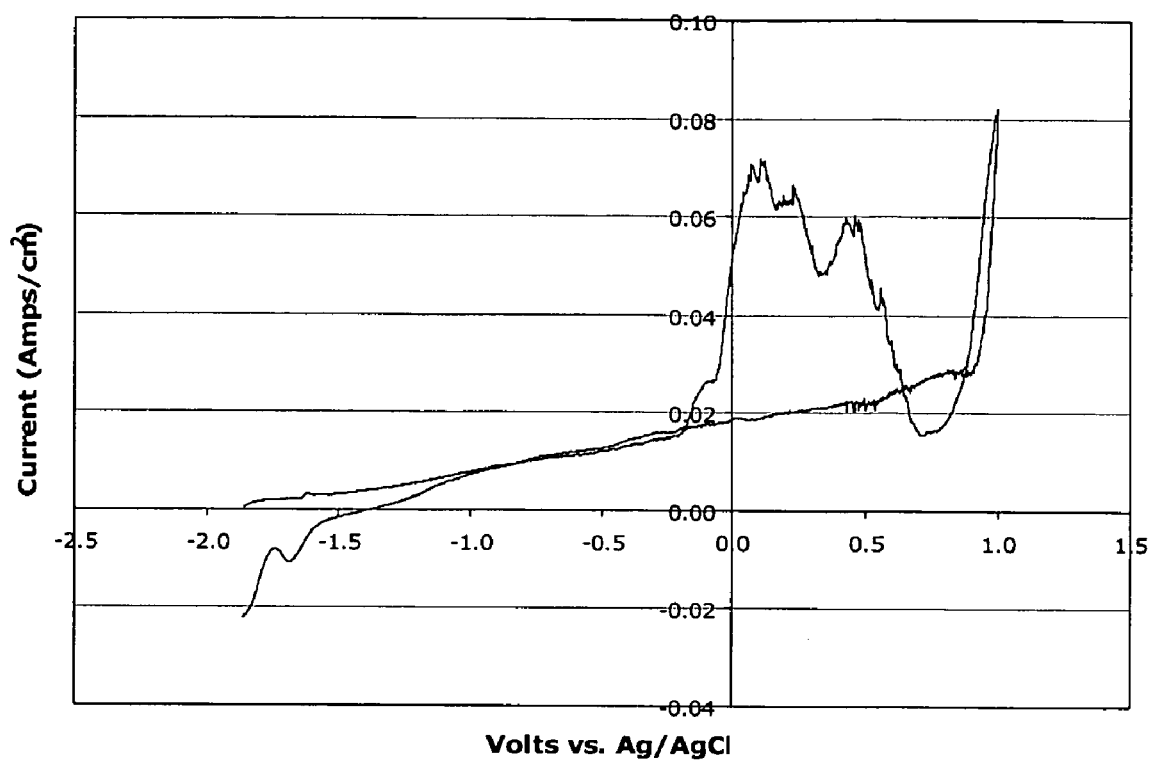
FIG. 4 illustrates a potentiodynamic scan of the liquid gallium electrode in the presence of $Li_3N$ in a LiCl—KCl molten salt solvent. The peak near 0.8 V vs. Ag/AgCl id due to oxidation of chloride ions.
Figure 5:
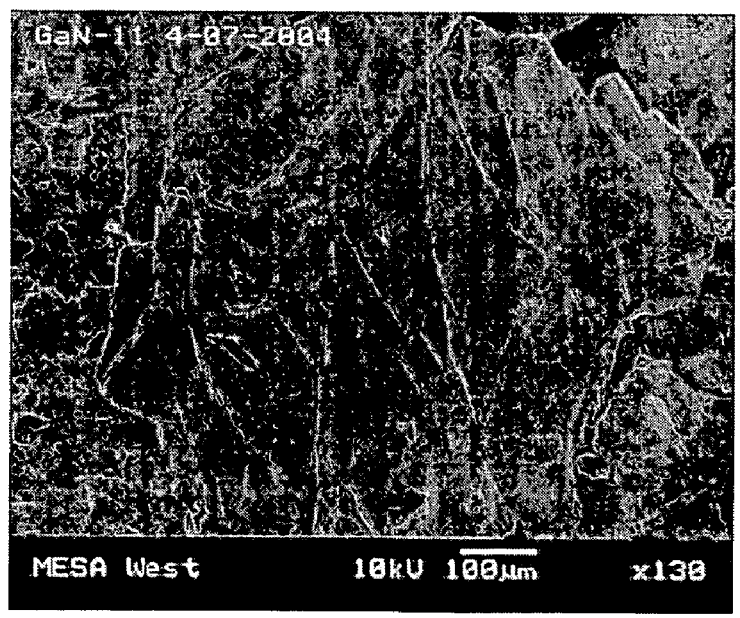
FIG. 5 is a scanning electron micrograph (SEM) of a GaN crystal formed by repeated potentiodynamic scans as illustrated in FIG. 4.

In some embodiments, one of the precursors is created by dissolution of a precursor compound while the other is created electrochemically. This combination precursor approach was used in the method of this invention to grow GaN. A LiCl—KCl eutectic mixture at 450° C., and Ga metal and Li$_3$N as the precursors were employed. A pool of molten gallium metal (located at the anode) was reacted with $N^{3-}$ in solution to yield multiple single crystals of GaN, the largest of these ranged from 0.5 to 0.9 mm in diameter. The formation of GaN was verified by powder X-ray diffraction. Two different electrochemical techniques were employed in these embodiments. The first used a controlled current density (galvanodynamic) while scanning the current between open circuit (0.000 A/cm$^2$) and about 2 mA/cm$^2$. During these scans, the voltage between the electrodes was maintained within the electrochemical window of the salt (~3.5V), and typically stayed between 0 and 1.7 V. The second embodiment for growing GaN controlled the voltage between the electrodes (potentiodynamic). The voltage ranged from −2.35 to 0.6 Volts vs. Ag/AgCl. The current densities ranged from microamperes/cm$^{-2}$ to about 100 milliamperes/cm$^{-2}$. The electrolyses were typically performed for between two and ten hours at 450° C. The potentiodynamic scan curve for this growth is shown in FIG. 4 and the GaN crystals resulting from this growth are shown in FIG. 5. This demonstration employed the LiCl—KCl eutectic molten salt, but it could alternatively have employed different alkali halide salts at temperatures appropriate for the chosen salt (i.e., hot enough to maintain a stable melt, below the boiling point of the salt, and below the melting point of the Group III nitride that is being grown). The choice of salt is limited by the reduction potential of the salt cation. Alkaline earth salts with appropriate temperature profiles may be used. The metal species could be any of the group III metals including boron, aluminum, gallium, and indium. The growth rate and morphology of the deposit may be controlled by several factors, including the applied current density, the chosen geometry of the growth apparatus, and the temperature and composition of the molten salt.

In one embodiment, the nitride precursor is made electrochemically while the group III precursor is dissolved in the molten salt solvent. Growth takes place on a nucleation site in the solution. The growth location is selected by a) a temperature gradient, such that the seed crystal is cooler than the rest of the melt; b) by evaporating off the solvent to increase supersaturation; and/or c) removal of the solvent by electrolytic reaction of the molten salt solvent, which also concentrates the solution and provides supersaturation. This method of growth selection is applicable to other embodiments using seeded growth. Forced salt flow can be employed to control the fluid dynamics and to control the location of precipitation. The $N^{3-}$ precursor is electrochemically generated at such a rate as to maintain its concentration in the molten salt solvent at a relatively constant desired level of supersaturation in the solution; that is, the equilibrium of the reaction III(dissolved precursor species)+$N^{3-}$⇔III-N+(reaction byproduct) lies just enough to the right to achieve the desired level of supersaturation at the growth temperature. The growth temperature is the temperature of the nucleation site or seed crystal where precipitation takes place.

Figure 6:
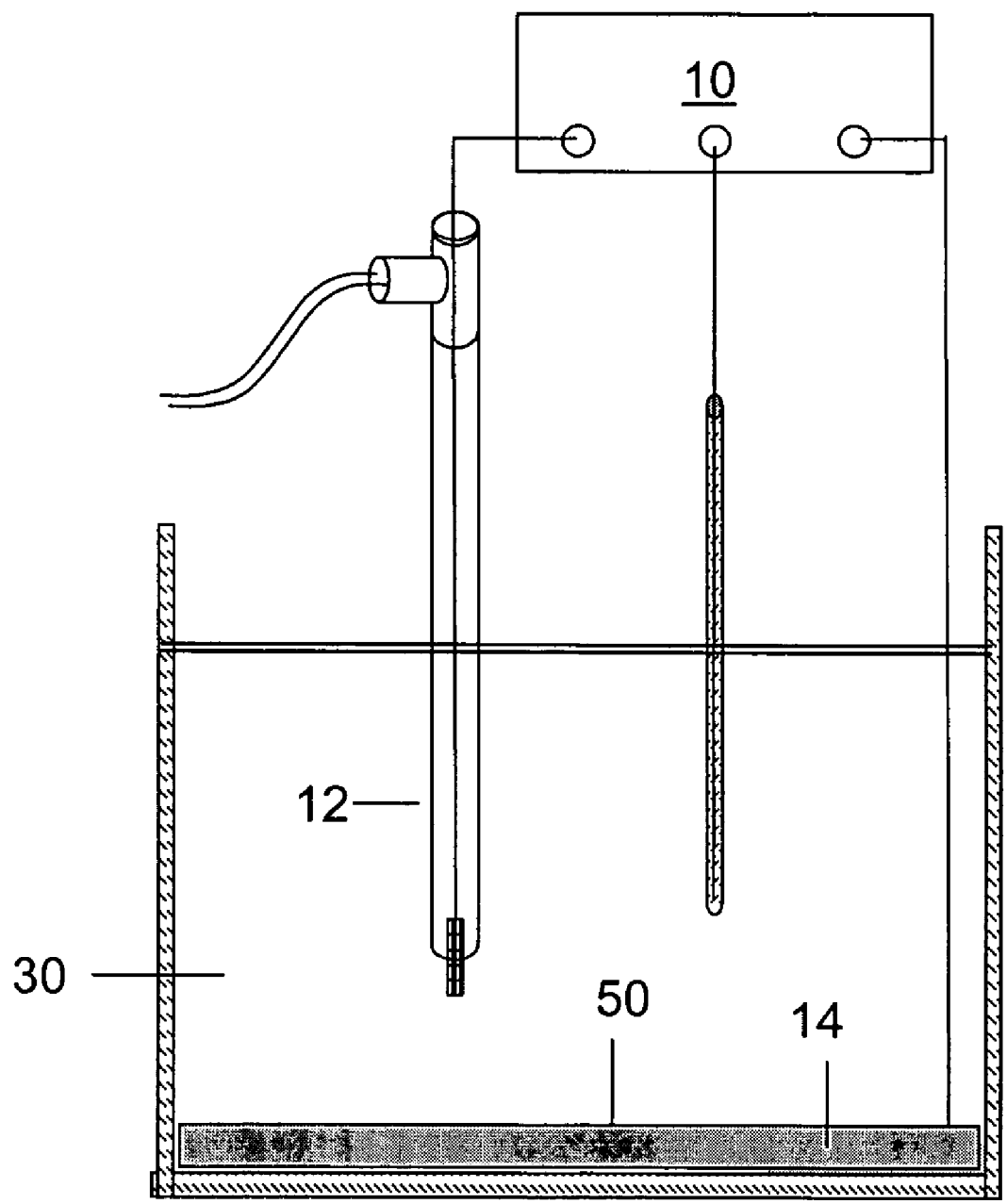
FIG. 6 illustrates the growth of Group III-nitride on the surface of a molten Group III metal electrode.

In one embodiment, the Group III ion is made electrochemically while the nitride precursor is dissolved in the molten salt solvent. Growth of III-nitride occurs on the surface 50 of the molten Group III metal electrode 14, as illustrated in FIG. 6. The electrodes are generally placed between 0.01 mm to 5 cm apart, but different separations can be used. Growth of III-N crystals can be accomplished in this embodiment using one of several varieties of electrochemical protocols. One protocol employs repeated scanning of the voltage (potentiodynamic deposition conditions) between −2.35 and 0.6 Volts vs. Ag/AgCl for liquid Ga anode and a nickel cathode. Another protocol employs repeatedly scanning of the current (galvanodynamic deposition conditions) between open circuit (0.000 A/cm$^2$) and about 100 mA/cm$^2$. The scan rates employed in the experiments described here were 4 mV/sec and 0.05 mA/3 sec (0.05 mA steps at 3 second intervals), but other scan rates can be used. Another protocol employs holding the potential of the working electrode constant (potentiostatic deposition conditions), for example, by holding the gallium electrode at 0.4 volts vs. Ag/AgCl at 450° C., or by holding the nickel electrode at e.g. −2.35 volts vs. Ag/AgCl for the desired growth time. Another protocol employs holding the current density constant (galvanostatic deposition conditions) for the desired growth time. Generally, the potentiostatic or potentiodynamic deposition conditions will produce the desired material.

It has been reported in the literature (T. Goto and Y. Ito, "Electrochemical Reduction of nitrogen gas in a molten chloride system," Electrochimica Acta, 43 (1998) p. 3379-3384) that a continuous, controlled supply of nitride ion ($N^{3-}$) may be formed in a molten chloride salt through electrochemical reduction of nitrogen gas at a nickel cathode. Nitrogen gas is attractive from a crystal growth perspective as it is easily purified, inexpensive, and its introduction into the reactor is easily controlled. Other nitrogen-containing precursors, such as nitride-containing powders (for example, $Li_3N$, $K_3N$, $Na_3N$, and $Ca_3N_2$, among others) may be dissolved in the melt as an alternative or a supplemental precursor to nitrogen gas.

In one embodiment, the temperature of the molten salt solvent is raised to a value higher than the desired growth temperature. Enough molecular III-N precursor is dissolved to saturate the molten salt solvent. The driving force for precipitation, termed the degree of supersaturation, is accomplished by subsequently cooling the solution to the desired growth temperature. A seed crystal is placed in the solution at the desired growth location to encourage nucleation and growth. Both ionic precursors ($III^{3+}$ and $N^{3-}$) are created electrochemically at electrodes sufficiently separated to prevent electrodeposition on one of the electrodes. The concentrations of the precursor ions are generated at a rate such that the reaction $III^{3+}+N^{3-} \Leftrightarrow III-N$ (in molten salt solvent) just exceeds equilibrium, that is, it is driven to the right. Thus, molecular III-N is produced in solution, and the rate can be tailored (via control of the current density) such that the production of III-N in solution is equal to the rate of precipitation at the growth surface. This has the advantage of maintaining a constant supersaturation, or driving force for precipitation, while allowing the use of a constant temperature profile (and thus constant growth temperature) in the molten salt solvent. A constant growth temperature is desirable as this is one of the more influential parameters on crystal quality, and this process property will be helpful in attaining reproducibility in a manufacturable process.

In one embodiment, GaN crystals are grown by the following steps. The metal halide salt is melted and brought to the desired temperature. In this embodiment, a LiCl—KCl eutectic is employed, but other materials may be used. Dry $Li_3N$ is added to the molten salt to a concentration between 0.0001 and 5 mole percent. The $Li_3N$ serves as a nitride ion primer that facilitates the nitrogen gas reduction reaction. A higher concentration of the nitride ion primer increases the rate of the nitrogen gas reduction. A metal (for example, a Group III electrode (anode) and a nickel counter electrode (cathode) are positioned at a fixed distance with respect to each other. For example, the distance can be less than about 1 cm, but, depending on reaction vessel geometry, can be a different distance from each other. The counter electrode can be made in a variety of geometries of a range of materials that do not react excessively with the molten salt, as known to those skilled in the electrochemical art. The counter electrode can alternatively be a gas electrode such as a nitrogen gas electrode. A reference electrode can be used but is optional. If a gas electrode is used, nitrogen gas or a nitrogen gas mixture can be used. Examples of nitrogen gas mixtures include but are not restricted to nitrogen diluted with argon or helium. The presence of the $Li_3N$ in the melt improves the kinetics of the electrochemical reduction of the nitrogen gas. A higher concentration of $Li_3N$ in the melt yields a faster nitrogen gas reduction reaction within the concentration limits listed above. The voltage or the current is scanned in such a fashion that the nickel is the anode (where reduction occurs) and the Group III metal is the cathode. For either voltage or current scanning, the voltage is maintained at values such that the components of the halide salt do not electrochemically oxidize or reduce at the electrodes. The scan rate is chosen to control crystalline quality or growth rate. In general, a slower scan rate produces larger and higher quality crystals than does a faster scan rate.

For electrochemical production of precursors, the preceding steps are employed with the exception that the electrodes are placed farther apart. The separation of the electrodes is referenced to the size of the crystals that are to be grown. For example, if a two-inch diameter crystal is to be grown, the electrodes can be placed with a separation that locates them on either side and farther apart than the diameter of the crystal that is to be grown or they can be placed closer than the diameter of the crystal to each other.

For one embodiment of the electrochemical production of precursors, the cathode is held at the appropriate oxidizing potential for the metal (for example, around 0.3 V vs. Ag/AgCl for gallium) to achieve the desired cationic species in solution and the anode is held at the appropriate voltage for nitrogen reduction, for example, −2.1 V vs. Ag/AgCl. This can be accomplished with one power supply or potentiostat (illustrated schematically for two cases in FIGS. 1 and 2) or with two power supplies or potentiostats (illustrated schematically for two power supplies or potentiostates in FIG. 3). These voltages are suitable for the reaction at 450° C. and are approximate to within about 100 mV. This voltage selection is not optimized for any particular property of the process and can be altered in a manner known to those skilled in the electrochemical arts.

When two different power supplies or potentiostats and two independent circuits are used (illustrated schematically in FIG. 3), it is helpful to locate the two sets of electrodes at locations that are well separated from each other. This minimizes crosstalk between the circuits. In this configuration, the counter electrode of each circuit will be oxidizing or reducing a component of the molten salt. If needed, salt may be added to the growth chamber if it is desirable to maintain a constant salt volume during growth.

Multiple independent circuits with multiple power supplies and/or multiple potentiostats providing electrical voltages and currents may be employed in this manner for the purposes of depositing pseudo-binary alloy crystals (ternary and quaternary compounds such as $Al_{1-x}Ga_xN$, $In_{1-x}Ga_xN$, and $Al_xIn_yGa_{1-x-y}N$), where additional circuit(s) are set up to generated the respective Group III cations in the solution.

For lateral uniformity, the location of the electrodes should be far enough away from the growth surface to ensure the homogenization of the solution via fluid mechanics near the boundary layer. They should be spaced on opposite sides of the crystal to prevent premature reaction of the ions at the electrode surfaces. The fluid dynamics of the molten salt may be controlled through thermal gradients (convection), pumps, stirring or forced convection, seed crystal or boule rotation, or other common mechanisms used to control fluid mechanics.

The electrodes can be located near the growth surface. For example, if the growth surface location is represented by the X-Y plane, the electrodes are spaced opposite each other in the XY plane, but close to the XY plane along the z-axis.

In some embodiments, the concentration of the precursors ($III^{3+}$ and $N^{3-}$) are maintained below the solubility limit for the III-nitride at the temperature of the molten salt solvent that is not immediately adjacent to the position where the III-nitride crystal is to be grown. Precipitation at this XY plane is controlled by a thermal gradient directed away from the XY plane that is selected to provide a growth rate that produces the desired crystal quality.

In some embodiments, a seed crystal is placed at the XY plane location to initiate nucleation and growth of the III-N crystals.

In some embodiments, the crystal can be rotated during growth to increase lateral uniformity of deposition.

In some embodiments, a combination of dissolution and precipitation is employed. In these embodiments, Enough III-nitride feedstock (for example, fine-grained polycrystalline powder of GaN, AlN, or InN) is added to the molten salt to achieve saturation with the III-nitride. In one embodiment, the temperature of the molten salt solvent is raised to a value higher than the desired growth temperature. Enough molecular III-N precursor is dissolved to saturate the molten salt solvent. Supersaturation and thus precipitation is achieved by a) employing a thermal gradient in the vicinity of the seed crystal such that the temperature at the surface of the seed crystal is cooler than the rest of the melt; b) by evaporating the solvent at a controlled rate to maintain a constant supersaturation and thus constant precipitation rate; or c) by electrolytic reaction of the salt constituents to remove the solvent at a controlled rate, thereby maintaining a constant degree of supersaturation and constant concentrations during precipitation. Forced salt flow is one technique that can also be employed to control the fluid dynamics and thus the lateral uniformity of the precipitation.

When the III-nitride is InN, the molten salt will be too hot for the InN to be stable and the InN will decompose upon contact with the molten salt. For some salts, the InN can decompose if included with the solid salt during the melting of the salt to produce the molten salt solvent. This problem can be mitigated by pressing the InN into a pellet and cooling it, for example in liquid nitrogen, and dropping the cold pellet quickly into the molten salt. The molten salt will stabilize the compound once is has been successfully introduced into the molten salt. Cold is defined as being room temperature or lower.

Gallium can have a similar problem with decomposition when attempting to put it into the molten salt. The procedure for InN works for GaN. An alternative method of GaN introduction involves adding the GaN to the molten salt near the melting point (for example, 650° C. For salts with melting temperatures higher than about 700° C., the cold pellet method works better than addition of uncooled GaN.

Since AlN is thermally stable until temperatures approaching 1800° C. are reached, the Al feedstock powder can be directly added to the molten salts.

Other materials that can be used as Group III cation precursors, such as $GaCl_3$, or as nitride precursors can be cooled to avoid decomposition, evaporation, and loss by other mechanisms during the process of addition to the molten salt solvent.

In some embodiments, dissolution of III-nitride feedstock and electrochemical production of precursors are combined.

After addition of the III-N feedstock, the solution is stirred until the III-nitride feedstock is dissolved and the solution is saturated or close to saturation. There should generally be some undissolved feedstock in the reaction vessel, indicating that saturation has been achieved.

Dissolution of III-N feedstock material (for example, as a powder) into a solvent that is liquid at the desired growth temperature at atmospheric pressure and precipitation of crystalline III-nitride as a result of supersaturation may be achieved in several ways. A thermal gradient can be established in the desired region of nucleation in the solution with precipitation occurring in the temperature regions where the concentration of Group III and nitride ions exceed the III-nitride solubility product. Precipitation can be induced by establishing a supersaturated solution of Group III and nitride ions and then allowing the solvent to evaporate, thereby concentrating the solution until the solubility product is exceeded. Electrolytic reaction of the molten salt solvent can be used to reduce the solvent volume to concentrate the solution until the solubility product is exceeded.

Addition of a "solubility catalyst" to a molten halide salt can increase the solubility of actinide nitrides in the molten salt. An example of this approach in the field of actinide nitride electrochemistry is found in T. Ogawa and K. Minato, "Dissolution and formation of nuclear materials in molten media," Pure Appl. Chem., 73 (2001) p. 799-806. The solubility catalyst may consist of one or more of the alkali, alkaline earth, transition metal, lanthanide, or actinide halides (hereafter called a "metal halide"). The solubility of the III-nitride is then a function of both temperature and the concentration of the catalyst in the melt. Crystal growth of the III-nitride from the molten salt can be controlled by removing the solubility catalyst from solution. This can be accomplished by electrochemically reducing the cation of the solubility catalyst at one electrode and simultaneously oxidizing the anion of the solubility catalyst at another electrode, since the applied voltage dictates which a species is removed from solution. This approach has the advantage of employing constant temperature throughout the reactor, which can simplify the design of the reactor. The crystal may be pulled from the melt in order to maintain a constant position of the growth surface in the melt and thus a constant distance from the electrode. If a particular solubility catalyst (M'X) is found to enhance the solubility of a single metal nitride species, for example GaN, while a different solubility catalyst (M"X) is found to assist in the dissolution of a second metal nitride species, for example InN, then alloyed nitrides, for example $In_xGa_{1-x}N$, may be formed by electroplating the respective metals of the two solubility catalysts, M' and M", out of solution at the rates and proportions required to precipitate the nitride alloy at the desired composition, This is facilitated by the characteristic that, in general, M' and M" will electroplate out of solution at different voltages. The notation MX is not intended to specify an oxidation state on the metal, nor is it meant to restrict the choice of catalyst material to those containing only a single halide in the molecular formula. For example, this notation represents materials of the general formula $MX_2$ as well as those of general formula MX.

A seed crystal can be included in the melt as a nucleation location. The seed crystal can be added before or after the salt is melted. The thermal gradient in the region of the seed crystal can be controlled to force precipitation, but thermal gradient control is not always required. The magnitude and direction of the thermal gradient will control the crystalline quality and growth rate, as described above. Rotation of the seed crystal can increase the uniformity of the growth.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for growing Group III nitride crystalline material comprising:
   forming a nitride ion by reducing a nitrogen gas;
   forming a Group III cation by oxidizing a liquid Group III metal; and
   combining the Group III cation and the nitride ion to form a Group III nitride.

2. The method of claim 1, further comprising performing in a molten salt solvent the steps of forming the nitride ion, forming the Group III cation, and combining the Group III cation and the nitride ion.

3. The method of claim 2, further comprising dissolving a Group III nitride in the molten salt solvent.

4. The method of claim 2, wherein the molten salt solvent is selected from the group consisting of LiF, NaF, KF, CsF, LiCl, NaCl, KCl, CsCl, LiBr, NaBr, KBr, CsBr, LiI, NaI, KI, and CsI.

5. The method of claim 2, wherein the molten salt solvent comprises LiCl and KCl.

6. The method of claim 2, wherein the molten salt solvent comprises a nitride ion primer.

7. The method of claim 6, wherein the nitride ion primer is selected from the group consisting of $Li_3N$, $Na_3N$, $K_3N$, and $Ca_3N_2$.

8. The method of claim 1, wherein the step of forming the nitride ion by reducing the nitrogen gas is performed by applying a reducing electrical potential.

9. The method of claim 1, wherein the step of forming the Group III ion by oxidizing the liquid Group III metal is performed by applying an oxidizing electrical potential.

10. The method of claim 1, wherein the Group III cation is selected from the group consisting of a B ion, an Al ion, a Ga ion, and an In ion.

11. A method for growing Group III nitride crystalline material comprising:
    dissolving a nitride ion precursor to produce a nitride ion in a molten salt solvent;
    forming a Group III cation by oxidizing a liquid Group III metal in the molten salt solvent; and
    combining the Group III cation and the nitride ion to form a Group III nitride.

12. The method of claim 11, wherein the molten salt solvent is selected from the group consisting of LiF, NaF, KF, CsF, LiCl, NaCl, KCl, CsCl, LiBr, NaBr, KBr, CsBr, LiI, NaI, KI, and CsI.

13. The method of claim 11, wherein the molten salt solvent comprises LiCl and KCl.

14. The method of claim 11, wherein the step of forming the Group III cation by oxidizing the liquid Group III metal is performed by applying an oxidizing electrical potential.

15. The method of claim 11, wherein the Group III cation is selected from the group consisting of a B ion, an Al ion, a Ga ion, and an In ion.

16. The method of claim 11, further comprising cooling the nitride ion precursor prior to the step of dissolving the nitride ion precursor in the molten salt solvent.

17. A method for growing Group III nitride crystalline material comprising:
    dissolving a Group III ion precursor to form a Group III cation in a molten salt solvent;
    forming a nitride ion by electrochemically reducing a nitrogen gas in the molten salt solvent; and
    combining the Group III cation and the nitride ion to form a Group III nitride.

18. The method of claim 17, wherein the molten salt solvent is selected from the group consisting of LiF, NaF, KF, CsF, LiCl, NaCl, KCl, CsCl, LiBr, NaBr, KBr, CsBr, LiI, NaI, KI, and CsI.

19. The method of claim 17, further comprising cooling the Group III ion precursor prior to the step of dissolving the Group III ion precursor in the molten salt solvent.

20. The method of claim 17, wherein the molten salt solvent comprises LiCl and KCl.

21. The method of claim 17, wherein the molten salt solvent comprises a nitride ion primer.

22. The method of claim 21, wherein the nitride ion primer is selected from the group consisting of $Li_3N$, $Na_3N$, $K_3N$, and $Cd_3N_2$.

23. The method of claim 17, wherein the step of forming the nitride ion by reducing the nitrogen gas is performed by applying a reducing electrical potential.

24. The method of claim 17, wherein the Group III cation is selected from the group consisting of a B ion, an Al ion, a Ga ion, and an In ion.

25. A method for growing Group III nitride crystalline material comprising:
    dissolving a Group III ion precursor to form a Group III cation in a molten salt solvent;
    dissolving a nitride ion precursor to form a nitride ion in the molten salt solvent;
    forming an excess of a constituent ion by applying an electrochemical potential; and
    combining the Group III cation and the nitride ion to form a Group III nitride.

26. The method of claim 25, wherein the constituent ion is a nitride ion formed by reducing a nitrogen gas.

27. The method of claim 25, wherein the constituent ion is a Group III cation formed by oxidizing a liquid Group III metal.

28. The method of claim 27, wherein the Group III cation is selected from the group consisting of a B ion, an Al ion, a Ga ion, and an In ion.

29. The method of claim 25, wherein the molten salt solvent is selected from the group consisting of LiF, NaF, KF, CsF, LiCl, NaCl, KCl, CsCl, LiBr, NaBr, KBr, CsBr, LiI, NaI, KI, and CsI.

30. The method of claim 25, wherein the molten salt solvent comprises LiCl and KCl.

31. The method of claim 25, further comprising cooling the Group III ion precursor prior to the step of dissolving the Group III ion precursor in the molten salt solvent.

32. The method of claim 25, further comprising cooling the nitride ion precursor prior to the step of dissolving the nitride ion precursor in the molten salt solvent.

* * * * *